(12) United States Patent
Pourquier et al.

(10) Patent No.: US 7,217,590 B2
(45) Date of Patent: May 15, 2007

(54) COLOR IMAGE SENSOR WITH ENHANCED COLORIMETRY AND METHOD FOR MAKING SAME

(75) Inventors: Eric Pourquier, Voreppe (FR); Louis Brissot, Sainte-Egreve (FR); Gilles Simon, Le Fontanil (FR); Alain Jutant, Meylan (FR); Philippe Rommeveaux, Coublevie (FR)

(73) Assignee: Atmel Grenoble S.A., Saint Egreve (FR)

( * ) Notice: Subject to any disclaimer, the term of this patent is extended or adjusted under 35 U.S.C. 154(b) by 334 days.

(21) Appl. No.: 10/485,695

(22) PCT Filed: Aug. 30, 2002

(86) PCT No.: PCT/FR02/02978

§ 371 (c)(1),
(2), (4) Date: Feb. 3, 2004

(87) PCT Pub. No.: WO03/019668

PCT Pub. Date: Mar. 6, 2003

(65) Prior Publication Data

US 2004/0251477 A1    Dec. 16, 2004

(30) Foreign Application Priority Data

Aug. 31, 2001   (FR)   ................................... 01 11334

(51) Int. Cl.
*H01L 21/00*   (2006.01)
(52) U.S. Cl. ........................................................ 438/70
(58) Field of Classification Search ................ 348/324; 250/208.1; 438/70
See application file for complete search history.

(56) References Cited

U.S. PATENT DOCUMENTS 4,477,835 A * 10/1984 Berger et al. ............... 348/324

| | | |
|---|---|---|
| 5,244,817 A | 9/1993 | Hawkins et al. |
| 5,274,250 A | 12/1993 | Miyake et al. |
| 5,568,574 A | 10/1996 | Tanguay et al. |
| 6,091,194 A | 7/2000 | Dunn et al. |
| 6,252,220 B1 * | 6/2001 | Jedlicka et al. .......... 250/208.1 |
| 6,257,491 B1 | 7/2001 | Fazekas et al. |

* cited by examiner

*Primary Examiner*—Carl Whitehead, Jr.
*Assistant Examiner*—Monica D. Harrison
(74) *Attorney, Agent, or Firm*—Lowe Hauptman & Berner, LLP (57) ABSTRACT

The invention relates to very small-sized color image sensors.

The sensor according to the invention is made by the following method:

the formation, on the front face of the semiconductive wafer (10), of a series of active zones (ZA) comprising image detection circuits and each corresponding to a respective image sensor, each active zone comprising photosensitive zones (12) covered with conductive and insulating layers (14, 16) enabling the collection of electrical charges generated in the photosensitive zones, the transfer of the wafer (10) by its front face against the front face of a supporting substrate (20), the elimination of the major part of the thickness of the semiconductive wafer, leaving a very fine semiconductive layer (30) on the substrate, this fine semiconductive layer comprising the photosensitive zones, the deposition and etching of color filters (18) on the semiconductive layer thus thinned.

18 Claims, 5 Drawing Sheets

COLOR IMAGE SENSOR WITH ENHANCED COLORIMETRY AND METHOD FOR MAKING SAME

The invention relates to electronic image sensors, and especially to very small-sized sensors with dimensions that enable the making of miniature cameras such as the ones that are to be incorporated into a portable telephone.

For this type of application, the entire camera needs to be made by methods that are as economical as possible so that the the apparatus is not prohibitively costly, since it is intended, in principle, for sale to the general public.

To achieve this result, it is sought firstly to make the image sensor and the electronic processing circuits if possible on a same monocrystalline semiconductor substrate (in principle silicon), and secondly as far as possible to make the various deposits of layers, the etchings, the heat-processing operations etc. collectively on a general substrate in the form of a wafer comprising many identical sensors, and then dice the wafer into individual sensors. Typically, a silicon wafer will comprise several thousands of individual chips each constituting the core of an image sensor and therefore a camera.

However, the hitherto proposed methods of making color image sensors and the structures of these sensors are not entirely satisfactory from the viewpoint of manufacturing quality-to-cost ratio: no manufacturing method has been found that is at the same time sufficiently simple, industrially efficient and compatible with increasingly stringent requirements as regards the quality of the image provided. One of the requirements especially is the quality of the colorimetry, determined especially by the sharp separation of light beams between neighboring photosensitive points covered with filters of different colors.

A color image sensor is classically made as follows: the process starts with a silicon wafer on the front face of which the following operations are performed: masking, implantation of impurities, the deposition of various temporary or permanent layers having different compositions, the etching of these layers, heat processing, etc. These operations define a matrix of photosensitive dots and electrical signal-processing circuits associated with these dots. Then, color filtering layers are deposited on the front face of the silicon wafer and these filtering layers are etched individually to define a matrix pattern: the matrix comprises, in rows and columns, groups of three or four juxtaposed filters of different colors for each image dot of the sensor. Each elementary filter is located above a respective photosensitive zone receiving the light of only one color. The immediately adjacent filters, which are on top of immediately adjacent photosensitive zones, have different colors. Finally, the silicon wafer is diced into chips each constituting an individual color image sensor.

The color filters are placed on top of the insulating, conductive and semiconductive layers that have served to define the photosensitive dots and their interconnections. They are at a distance of several micrometers above the silicon zones which convert the light photons into electrons. This vertical distance is not negligible relative to the horizontal dimensions of a photosensitive dot and induces the following phenomenon: the photons that have crossed a color filter do not immediately reach the photosensitive zone corresponding to this filter. In the path that remains to be traveled after the color filter, they may be scattered, undergo refracted, reflected, etc. The result of this is that a portion of the photons may reach a neighboring photosensitive zone. If the work were to be done in monochromatic light, this would not be very important: the result would be a slight loss of spatial resolution which would affect only the image zones containing high spatial frequencies. However, in a color camera, the problem is far more critical because even image zones having only low spatial frequencies (for example a uniformly red-colored image zone) are highly affected: the color systematically deteriorates because the pixels corresponding to the other colors systematically receive a fraction of the light flux that is not intended for them. The quality of the colorimetry is therefore particularly affected by the scattering of light in the interval between the color filter and the photosensitive zone that corresponds to it.

This problem is particularly critical in CMOS image sensor technologies. Such a technology, based on photodiodes as photosensitive elements, is coming into increasing use because it enables the making, on a same integrated circuit chip, of the image sensor (the matrix of photosensitive dots) as well as the associated signal-processing and control circuits. Now this technology requires the depositing of numerous dielectric and metal layers on top of the level of silicon at which the photosensitive zones proper are made. The result of this is that the color filters deposited above this stack are particularly distant from the photosensitive zones, and the phenomenon of deterioration of the colorimetry is particularly marked. In this case, the height of the stack easily reaches about ten micrometers.

The present invention is aimed at proposing a method of making a color image sensor and structure of such a sensor that notably improve the colorimetrical quality of the images obtained, at the cost of a small but acceptable increase in the complexity of making the sensor and without impairing other qualities such as compactness and sensitivity under weak light.

To this end, the invention propose a method for making a color image sensor, comprising:

the formation, on the front face of a semiconductive wafer, of a series of active zones comprising image detection circuits and each corresponding to a respective image sensor, each active zone comprising photosensitive zones covered with insulating and conductive layers enabling the collection of electrical charges generated in the photosensitive zones, the transfer of the wafer by its front face against the front face of a supporting substrate, the elimination of the major part of the thickness of the semiconductive wafer, leaving a very fine semiconductive layer on the substrate, this fine semiconductive layer comprising the photosensitive zones, and subsequently the deposition and etching of color filters on the semiconductive layer thus thinned.

It will be understood that, with this method, the color filters are no longer on top of the stack of insulating and conductive layers that may have been deposited (by CMOS technology or any other technology) on the photosensitive zones during the fabrication of the semiconductive wafer. On the contrary, the filters are placed on top of the photosensitive zones, opposite the insulating and conductive layers which are then on the other side of the photosensitive zones. This means that, in the use of the sensor in a camera, the light will go through the color filters and directly reach the photosensitive zones without having to cross the stack of insulating and conductive layers.

This method of manufacture requires the transfer of the semiconductive wafer on to a substrate and a thinning of the semiconductive wafer. Transfer and thinning techniques are being mastered with ever-greater efficiency so that the excess cost of the operation will be acceptable for a remarkably enhanced image.

The compactness of the sensor (since it is sought to make very small-sized sensors) does not deteriorate and its sensitivity under weak light is thereby even improved.

The image sensor according to the invention therefore essentially comprises, on a supporting substrate, a superimposed unit comprising firstly a very thin semiconductive layer in which there is formed a matrix array of photosensitive zones and, secondly, a stack of insulating and conductive layers enabling the collection of the electrical charges generated by light in the photosensitive zones, and it is characterized by the fact that color filters are deposited on this superimposed unit, on the very thin semiconductive layer side, so that the light passes through in the order given, through the color filters and then the photosensitive semiconductive zones, then reaching the stack of insulating and conductive layers without encountering a system of conductive layers before reaching the array of photosensitive zones.

The transfer of the semiconductive wafer can be done by gluing, classic soldering, anodic bonding or by simple molecular adhesion (i.e. through the very great force of contact between two surfaces having great planeity).

The thinning of the wafer after transfer to the substrate and before the deposition of the color filters can be done in many different ways: thinning by lapping, chemical thinning, a combination of both types of thinning (first mechanical thinning and then chemical finishing or else mechanical machining in the presence of chemicals). The thinning can also be done by a preliminary embrittlement of the wafer at the desired dicing level, in particular by in-depth hydrogen implantation in the desired dicing plane. In this case, the hydrogen implantation is done at a shallow depth in the semiconductive wafer before the transfer of the wafer to the substrate. The thinning is then done by heat processing which dissociates the wafer at the level of the implanted dicing plane, leaving a thin semiconductive layer in contact with the substrate.

The very great thinning of the wafer reduces its thickness from several hundreds of micrometers before transfer to the substrate to 3 to 20 micrometers after transfer to the substrate.

Preferably, the integrated circuit chip corresponding to an individual sensor comprises a matrix of photosensitive elements as well as control circuits of the matrix and associated image-processing circuits receiving signals coming from the photosensitive elements of the active zone. The circuits thus associated with the matrix are preferably masked against light by a layer of aluminum, only the matrix being exposed to light.

In a particular embodiment, metallized via holes are formed on the supporting substrate, prior to the transfer of the semiconductive wafer. These via holes are laid out with the same geometry as connection pads formed on the semiconductive wafer around each active zone (hence at the periphery of each individual image sensor). During the transfer, the connection pads come into contact with the metallized via holes, and connections to the exterior may be made behind the supporting substrate. The image sensors may furthermore be tested on the wafer, before being ed into individual sensors after the operations of transfer, thinning, deposition and etching of the color filters. The semiconductive wafer is preferably made of silicon. The supporting substrate may be made of silicon. It may also be made of any other material whose expansion coefficient is compatible with that the silicon so as not to create excessive stresses during the temperature variations to which the wafer/substrate structure is subjected.

Other features and advantages of the invention shall appear from the following detailing description, made with reference to the appended drawings, of which.

Figure 1:
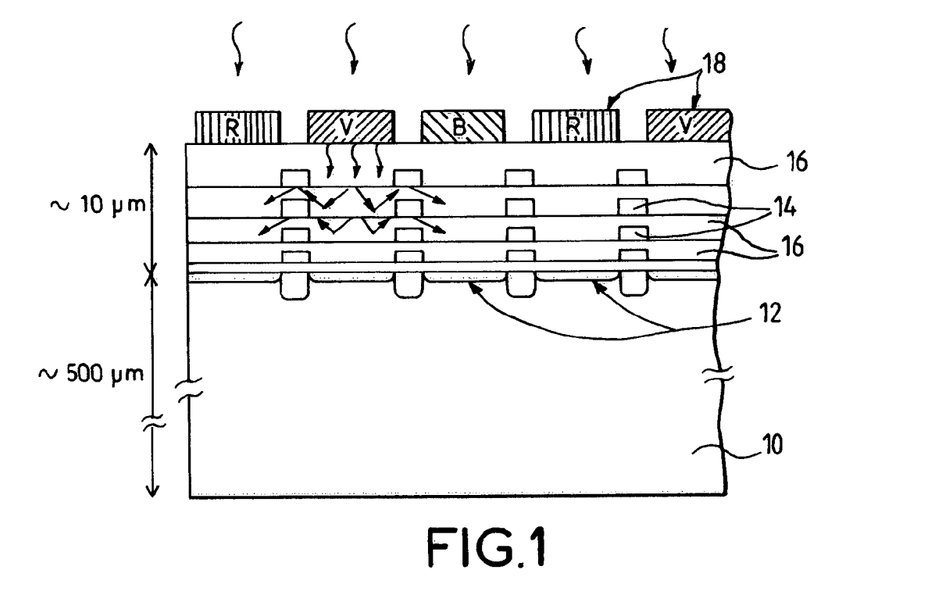
FIG. 1 shows a standard CMOS color image sensor.

FIG. 1 briefly recalls the principle of a prior art color image sensor. The sensor is made on a silicon substrate 10 several hundreds of micrometers thick, this thickness being that of the silicon wafer on which numerous individual image sensors are made simultaneously.

The image detection circuits (the matrix of photosensitive dots, transistors and interconnections) are fabricated on one face of the silicon wafer, which may be called the front face and is the upper face in FIG. 1. Fabrication implies, firstly, various operations of diffusion and implantation in the silicon, from the upper face of the wafer, to form especially photosensitive zones 12, and, secondly, successive operations for the deposition and etching of conductive layers 14 and insulating layers 16 forming a stack on top of the photosensitive zones 12. The insulating and conductive layers form part of the image detection circuits and enable the collection of electrical charges generated in the photosensitive zones by an image projected on the sensor.

On top of the stack of conductive and insulating layers, there is a matrix of color filters 18 so that each individual photosensitive zone 12 has a particular corresponding color filter 18, the photosensitive zone 12 receiving, in principle, only the light that has crossed the corresponding color filter. The adjacent photosensitive zones correspond to different colors, for example red, green, blue or cyan, magenta and yellow, and a trichromatic image dots corresponds to three (or sometimes four) adjacent color filters.

During use, the light modulated by the image to be detected reaches the filters, crosses the conductive and insulating layers and reaches the photosensitive zones.

The insulating layers are, in principle, indeed transparent but the conductive layers are most usually opaque and reflective. The photosensitive zone proper is therefore not placed beneath portions of conductive layers and the light reaches the photosensitive zone directly after passing into the color filters and the insulating layers.

However, the multiplicity of superimposed insulating layers and the presence of conductive layers, most usually made of aluminum, on the sides creates numerous instances of refraction and reflection that become a part of the light coming from a color filter to the photosensitive zones that do not correspond to this filter. Even a low percentage of light thus deflected severely impairs the colorimetrical performance of the sensor.

Figure 2:
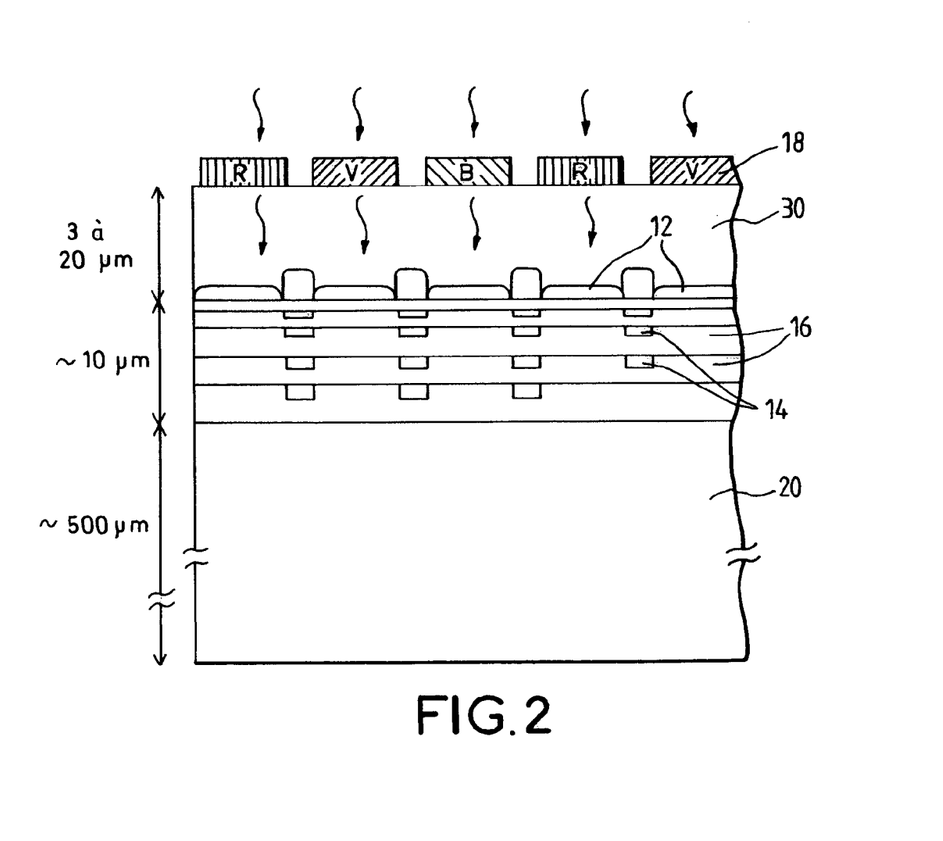
FIG. 2 shows a color image sensor according to the invention.

FIG. 2 shows the sensor according to the invention. The sensor comprises a substrate 20 that first of all carries a superimposed set of two groups of layers. One of the groups which, in the embodiment of FIG. 2, is borne directly on the substrate 20, is a stack of conductive layers 14 and insulating layers 16, similar to the stack of conductive and insulating layers 14 and 16 of FIG. 1 but arranged in reverse. This stack may have a thickness of about ten micrometers. The second group of layers comprises a very thin silicon layer 30 (with a thickness of three to 20 micrometers approximately) in which photosensitive zones 12 have been formed by implantation and/or diffusion of impurities. The conductive and insulating layers 14 and 16 define electrical circuits enabling the collection of electrical charges generated by light in the photosensitive zones 12. The unit comprising the zones 12, the layers 14 and the layers 16 is similar to that of FIG. 1, but is positioned upside-down, namely turned towards the bottom.

Color filters 18 are deposited on the very thin silicon layer 30, opposite the conductive and insulating layers, so that the light passes in the following order: it goes through the color filters and then in the photosensitive silicon zones, and then possibly in the insulating and conductive layers. It can be seen that the embodiment of FIG. 8 comprises a stack different from that of FIG. 2 in that the substrate, which is then transparent, bears first of all the color filters and then the very thin silicon layer, and then the stack of insulating and conductive layers. However, the color filters are still opposite the stack of insulating and conductive layers and adjacent to the very thin silicon layer, contrary to what is shown in FIG. 1.

Consequently, on top of the photosensitive zones 12, between the plane of these zones and the plane of the color filters, there is generally no system of electrical linking conductors. All the etched conductive systems that bring about the functioning of the photosensitive matrix are beneath the photosensitive zones and the color filters that cover them.

The photons that cross the color filter 18 are absorbed in the very thin silicon layer 30 and produce electrical charges collected in the photosensitive zone 12 (in practice a photodiode) located beneath the color filter. The electrical charges are collected by the conductors of the stack located beneath the photosensitive zone. This stack of insulating and conductive layers is not a barrier to the photons and does not create any deflection toward the neighboring photosensitive zones. Only the photons not absorbed by the silicon layer 30 get lost in these layers.

The method of making the sensor of FIG. 2 consists on the whole in preparing a silicon wafer exactly as in the making of a traditional sensor such as that of FIG. 1, except for the positioning of the color filters. This wafer is then attached to another wafer, or supporting wafer, which will constitute the substrate 20. In this operation, the front face of the silicon wafer bearing the photosensitive circuits is applied against the supporting wafer (which may be designated by 20 since it constitutes the substrate 20 of FIG. 2). At this stage, the work is done on wafers (with a diameter of 150 to 300 mm for example) and not on individual sensors.

It is preferable to make the front face of the silicon wafer properly plane before the transfer operation, since the operations for the deposition and etching of the stack of insulating and conductive layers 14, 16 will have created a relief on this face. This "planarization" is done classically by the deposition of an insulating layer that fills the hollows of the relief. This planarization layer does not need to be transparent.

The transfer of the silicon wafer to the supporting wafer 20 can be done by several means. The simplest means could be quite simply that of holding the wafer by molecular adhesion, since the great planeity of the surfaces in contact generates very high contact forces. Gluing is also possible. As will be seen further below, it is also possible to set up a mechanical and electrical bond between contact pads of the silicon wafer and corresponding contact pads of the supporting wafer 20 by means of conductive organic or metal bosses.

After the silicon wafer has been transferred by the front face to the supporting wafer, the major part of the thickness of the silicon wafer is eliminated so as to leave only a thickness of about 8 to 30 micrometers, including the thickness of the stack of layers. What remains of the silicon wafer is no more than a superimposition of a few micrometers (5 to 10 micrometers for example) for the stack of layers 14, 16 and about three to 20 micrometers for the remaining silicon thickness, including the photosensitive zones 12. The remaining thickness is that of the layer 30 of FIG. 2.

The thinning operation can be done by a mechanical machining (lapping) terminated by chemical machining, or by mechanical/chemical machining, or by chemical machining only, or again by a particular method of separation necessitating a preliminary implantation of an embrittling impurity in the plane that will demarcate the thinned silicon layer.

In the case of this separation by implantation of impurities, the implantation must be done before the transfer of the silicon wafer to the supporting wafer. Indeed, the implantation is done by the front face of the silicon wafer, throughout the surface of the wafer and at a depth that will define the dicing plane. The preliminary implantation is preferably hydrogen implantation. It can be done at various stages of the making of the wafer, but the separation of the thickness of the wafer along the implanted dicing plane can be done only when the silicon wafer has been attached to the supporting wafer. This separation is done essentially by a heat-processing operation generating stresses that divide the wafer into two along the pre-implanted dicing plane.

The upper surface of the thinned silicon layer 30 can be processed (fine lapping, chemical cleaning, mechanical/chemical polishing, etc.) in order to eliminate the surface defects, after which the color filters can be deposited and etched, leading to a multiple-sensor wafer whose general structure is that of FIG. 2. If desired, one or more additional layers can be deposited before the deposition of the color filters, especially passivation layers, anti-reflection layers and other layers, for example layers needed for the electrical activation of the doped silicon layers (electrical polarization layers). These additional layers are designated by the reference 19 in FIG. 2 and are not shown in the other figures.

Figure 3:
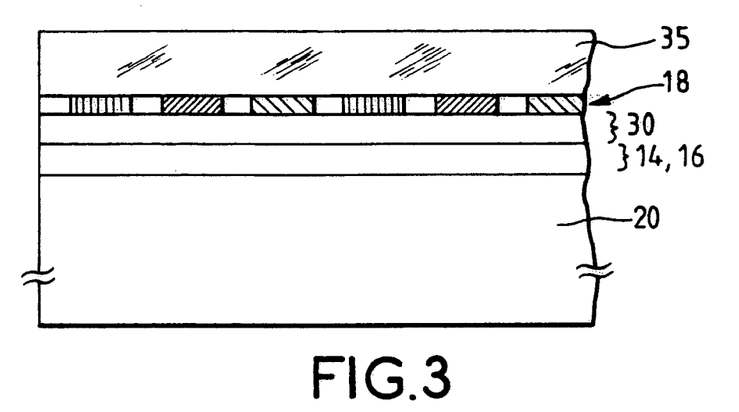
FIG. 3 shows a particular embodiment of the sensor according to the invention with a transparent protective layer on top of the color filters.

FIG. 3 shows an embodiment in which, starting from FIG. 2, there is an additional transparent layer 35 throughout the surface of the sensor. This layer 35, made of glass or transparent plastic material, is applied closely against the surface that bears the filters. It absorbs few photons and protects the surface of the color filters and the silicon beneath. This layer may have a thickness ranging from some micrometers to some hundreds of micrometers. A planarization layer may be deposited on the color filters before the deposition of the layer 35 to remove the irregularities of relief due to the color filters.

It must be noted here that the transparent layer 35 may be placed on the unit carried by the substrate 20 while it is still in wafer form (with a diameter of 6 or 8 inches for example) bearing numerous individual image sensors.

FIGS. 4 to 7 show various ways of setting up contacts between the sensor and the exterior, for example to convey control signals and a supply of power, and collect the electronic signals representing the image detected by the sensor. Here too, these contacts are obtained while working on the wafer, before the wafer is divided into individual sensors.

Figure 4:
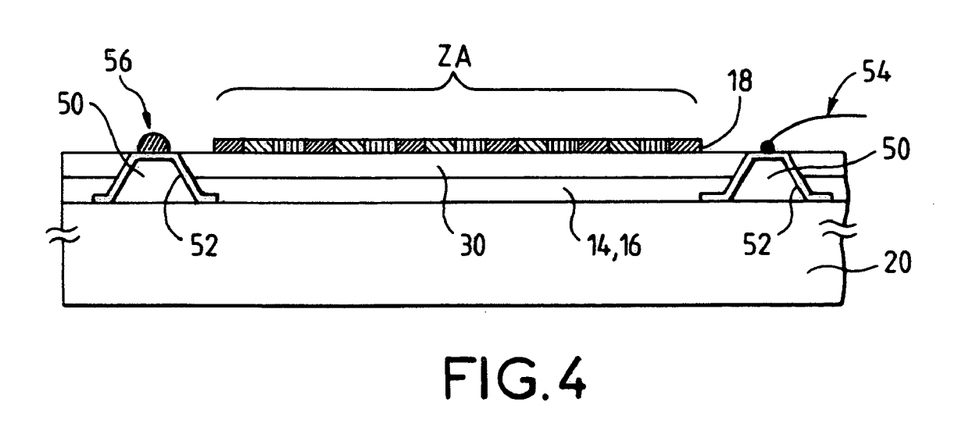
FIG. 4 shows a possible mode of connection of the sensor with the exterior, by metallized access wells formed in the silicon wafer before transfer to the supporting substrate.

In the embodiment of FIG. 4, access wells 50 have been created in the front face of the silicon wafer (the face pointed toward the bottom of FIG. 4 ), before the transfer of the supporting wafer. These access wells 50 extend to a depth of three to 20 micrometers beneath the initial surface of the silicon, and extend more precisely exactly up to the depth at which the silicon wafer will be thinned.

The access wells thus hollowed out are located on the periphery of each individual sensor, the photosensitive active matrix zone ZA being surrounded by the series of wells 50 (whose number may typically be 30 or 40 for an individual image sensor). The wells 50 are filled with a conductive material 52 (such as aluminum, copper, tungsten, etc.) that comes into contact, on the upper surface of the silicon wafer (the face pointed downwards, in contact with the transfer substrate 20), with one or more conductive layers 14, more specifically with those layers that require contact with the exterior. Before the wells are filled with the conductive material, it is preferable to deposit an insulating layer (not shown) on the inner walls of the wells to insulate the contacts from the silicon layer 30.

During the thinning of the silicon after transfer, the major part of the thickness of the silicon is eliminated until the metal 52 of the wells 50 is flush with the surface being thinned. This metal can then be used either directly or after additional operations of deposition and etching, to set up areas of contact with the exterior. It is possible to fix solder wires 54 (for wire-bonding) therein in order to transfer the sensor by the rear face against a printed circuit board, or on the contrary conductive bosses (for example indium beads 56) in order to obtain a transfer of sensor by the front face against a printed circuit board (using the "flip-chip" technique). In this case, obviously, the printed circuit board is open at the position of the photosensitive matrix to let through light. The wire-bonded version 54 and the boss version 56 are shown in the same FIG. 4 but obviously only one version can be used in the same sensor.

The color filters 18 are positioned after the thinning of the silicon wafer.

Figure 5:
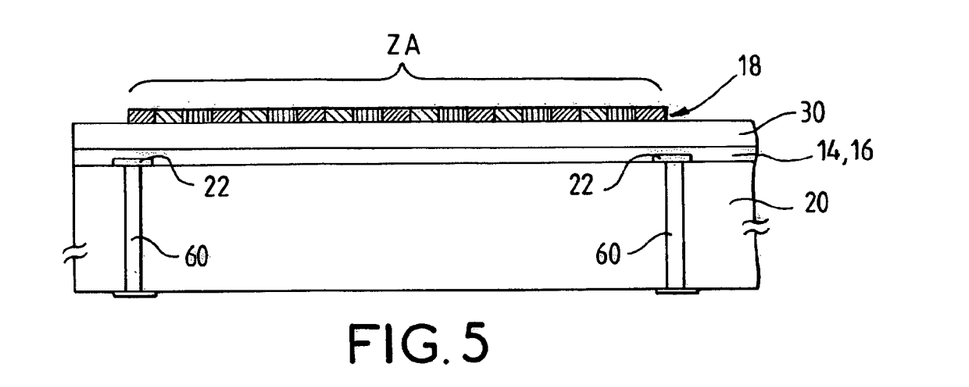
FIG. 5 shows another possible mode of connection with metallized via holes formed in the supporting substrate before the transfer of the wafer.

FIG. 5 shows another embodiment for setting up connection contacts with the exterior. In this embodiment, the supporting wafer 20 to which the silicon wafer has been transferred has been prepared beforehand by the formation of conductive via holes 60 crossing the entire thickness of the support. These via holes open into both faces of the supporting wafer and they are laid out exactly facing connection pads 22 formed in the front face of the silicon wafer on the periphery of the active zone ZA of each individual image sensor.

When the silicon wafer is transferred to the supporting wafer, the contact is thus made between the conductive via holes 60 and the image detection circuits of the silicon wafer.

The conductive via holes that open into the rear of the supporting wafer 20 enable all sorts of connections with the exterior such as wire-bonding, flip-chip or other connections.

It will be noted that the connection is made while work is still being done on the silicon wafer and that is possible to carry out a test (probe test) on the image sensors on the wafer. This is very advantageous from the viewpoint of the cost of the test. This observation can also be applied to the other modes of connection described herein (FIGS. 4, 6, 7).

Figure 6:
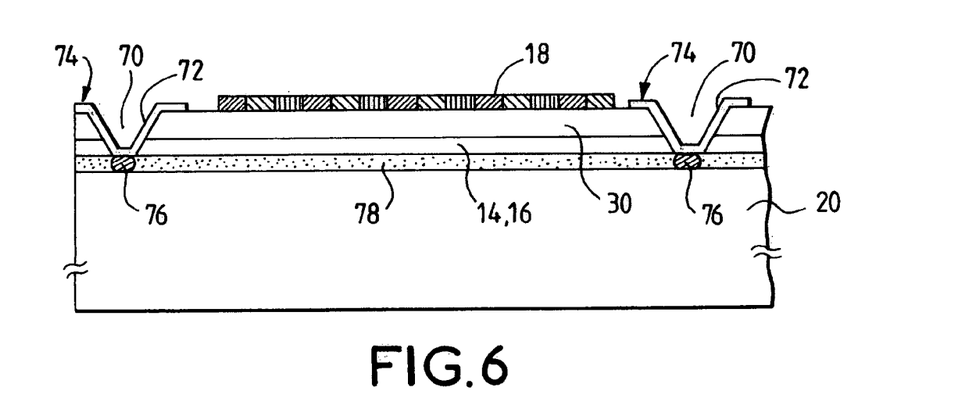
FIG. 6 shows yet another possible mode of connection, with metallized access wells formed after the thinning operation.
Figure 7:
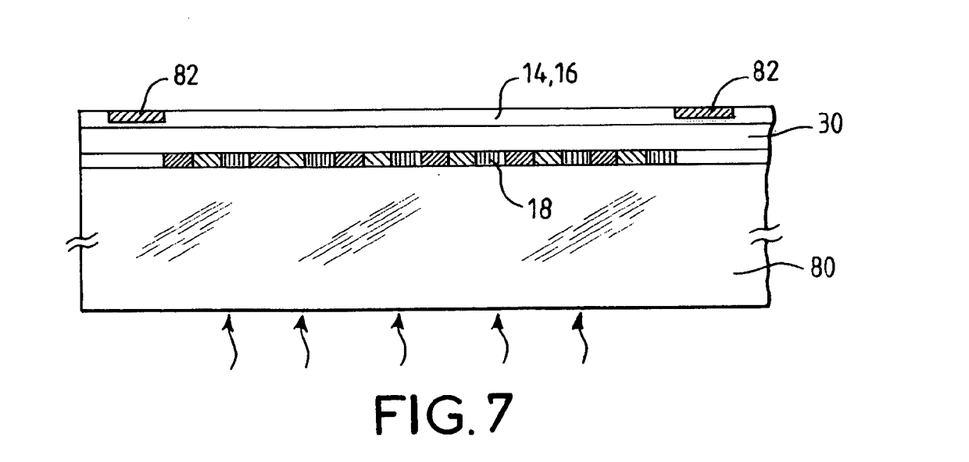
FIG. 7 shows an alternative embodiment of the sensor according to the invention, wherein a definitive substrate is transparent, the color filters being located between the transparent substrate and the thinned silicon layer.

FIG. 6 describes an embodiment in which the contact is achieved by means the following operations: after the thinning of the silicon wafer, access wells 70 are made not only in the thinned silicon layer 30 but also in some of the insulating layers 16, until they are flush with the conductive metal of the conductive layer 14 with which it is sought to make a connection with the exterior. These wells 70 are then metallized by the deposition of a conductive layer 72 that comes into contact with the layer 14 and is flush with the surface of the thinned silicon layer 30 to form external contact pads 74.

Furthermore, in the embodiment of FIG. 6, it can also be planned that the operation to transfer the silicon wafer to the supporting wafer 20 will be done by soldering, preferably through conductive bosses 76 (indium beads for example), between conductive areas of a layer 14 of the silicon wafer, and conductive areas facing the first areas, formed in the supporting wafer 20. Then preferably, a filler resin 78 fills the space left free between the two wafers separated by the thickness of the bosses. This resin ensures the rigidity of the wafer during and after the thinning.

It will be noted that, in the embodiment of FIGS. 4 to 6, the supporting substrate 20 may include active or passive circuit elements, especially when the substrate is made of silicon: integrated circuits may be formed in this substrate according to the standard technology for the making of integrated circuits, enabling the integration into the image sensor of additional electronic functions other than those integrated in the silicon layer 30.

FIG. 7 shows an alternative embodiment with the following particular features: the color filters 18, the thinned silicon layer 30 and the stack of conductive and insulating layers 14 are positioned in this order on a transparent substrate (made of glass or plastic material) 80. The image to be detected will be seen through the transparent substrate and will pass first of all through color filters to reach the photosensitive zones of the thinned silicon layer 30 ; the color photons corresponding to the filters crossed will be absorbed in the layer 30; only the non-absorbed photons will be able to reach the stack of insulating and conductive layers of 14, 16.

Connection pads 82, made by metal deposition and etching, and forming part of a layer 14 or being in contact with the layer 14 are provided on the upper face of the unit (toward the top of FIG. 7).

To obtain this structure, it must be understood that a first transfer of the silicon wafer is made on a supporting wafer 20, as in the embodiment of FIG. 2, followed by a second transfer of the structure of FIG. 2 on to a transparent substrate 80 and a total or partial elimination of the supporting wafer 20 which has served only as a temporary support.

For this purpose, starting from the structure of FIG. 2, made as described further above, the upper surface bearing the color filters is planarized if necessary, to give it planeity compatible with a new transfer (especially very high planeity if the transfer is done by molecular adhesion). The planarization resin must be transparent because it will be on the path of the light upstream from the photosensitive zones.

The structure thus planarized is then transferred to the substrate 80, the color filters of the planarization layer being in direct contact with the transparent substrate 80. The major part or even the totality of the substrate 20 is eliminated by mechanical and/or chemical means, or by embrittlement by hydrogen implantation for example as already explained. In this case, the hydrogen implantation in the supporting wafer 20 must be done prior to the first transfer of the silicon wafer to the wafer 20. This means that, between the transfer to the wafer 20 and the transfer to the substrate 80, no operation is performed at temperatures liable to cause a break at the hydrogen implantation plane.

With the temporary substrate 20 being eliminated, the connection pads 82 connected to the conductive layers 14 of the image detection circuits may be flush with the surface of the structure de FIG. 7.

FIGS. 8 to 12 describe a detail of an embodiment in the case of the sensor of FIG. 5.

Figure 8:
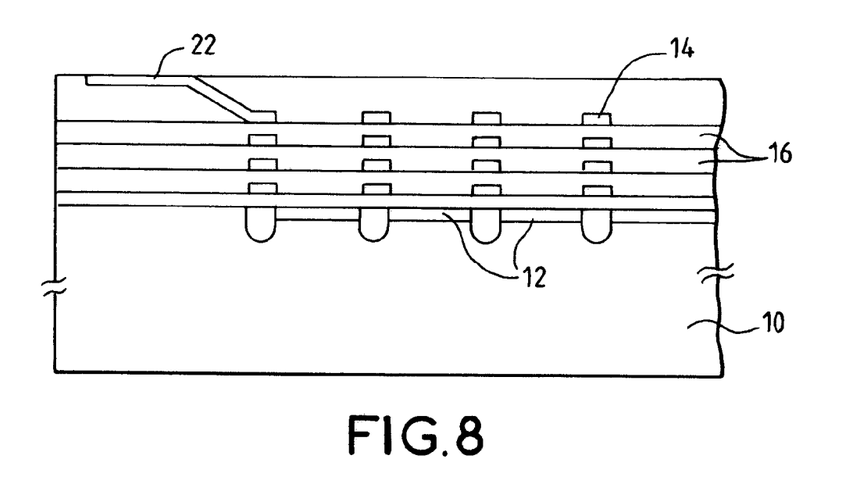
FIGS. 8 to 12 show the different steps of the making of the sensor in a practical example corresponding to the embodiment of FIG. 5.

FIG. 8 shows the general structure of a silicon wafer on which classic techniques have been used to make the image detection circuits of a large number of image sensors, with photosensitive zones 12, covered by a stack of conductive layers 14 and insulating layers 16.

Connection pads 22 are made on the upper surface of the wafer.

If the sensor were to be made by means of a classic technology, then a mosaic of color filters would be deposited on the surface of the wafer.

Figure 9:
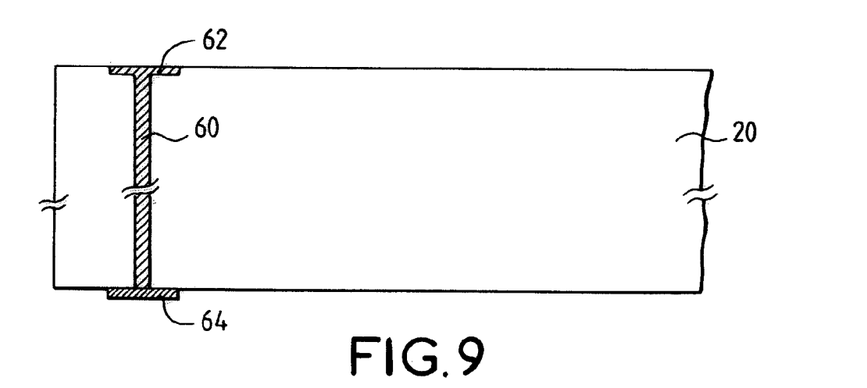

According to the invention, no color filters are deposited at this stage but the wafer is transferred by its front face to a transfer substrate 20 that is shown in FIG. 9.

The substrate 20 is a wafer having the same diameter as the wafer 10 and a similar thickness to ensure the rigidity of the structure while it is being made. It may furthermore be constituted by another silicon wafer.

The transfer wafer comprises metallized via holes 60, crossing its entire thickness, laid out with the same geometry as the input/output pads 22 formed on the silicon wafer 10.

At the upper part of each metallized via hole there is a conductive area 62 liable to enter into direct contact with a pad 22 of the wafer 10 during the transfer of the wafer 10 to the substrate 20. At the lower part of each metallized via hole, there will also be a metallized area 64.

The transfer can also be done after the deposition of a planarization layer serving to fill the relief features created on the front face of the silicon wafer by the operations of deposition and etching of the stack of conductive and insulating layers. This planarization layer does not need to be transparent. It must leave the upper surface of the conductive pads 22 free.

Figure 10:
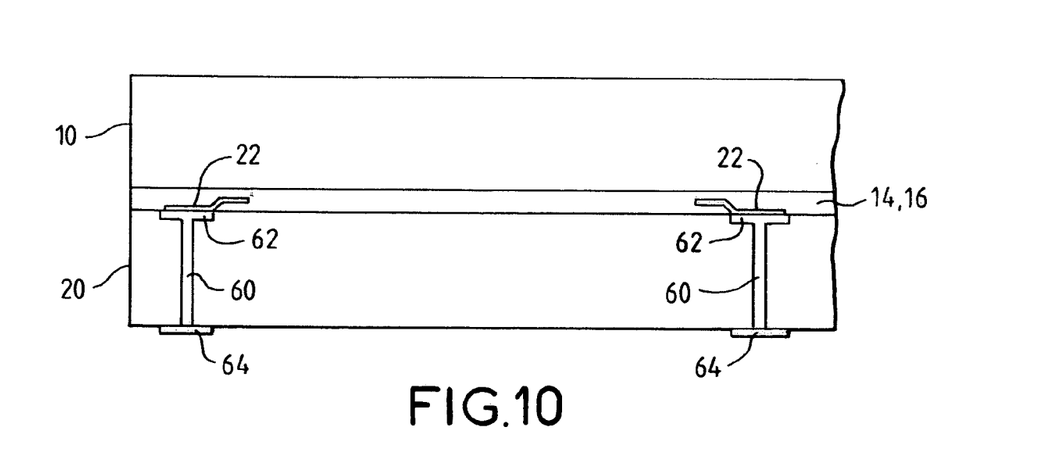

FIG. 10 shows the wafer 10, overturned with its upper face downwards and in contact by this upper face with the upper face of the transfer substrate 20.

The transfer is done by bonding or by molecular adhesion. It can even be done by soldering of the pads 22 to the areas 62.

Figure 11:
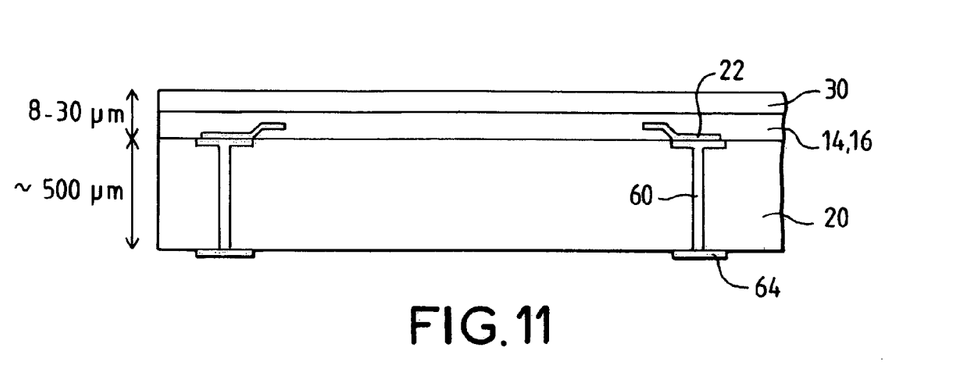

After this transfer, the silicon wafer is thinned until all that is left is a thickness of 15 to 30 micrometers, including the thickness of the stack of layers 14, 16. The remaining silicon thickness 30 and the stack of layers 14, 16 contain all the image detection circuits (FIG. 11).

Finally, a mosaic of color filters and possibly also a transparent film or even microlenses (FIG. 12) are deposited on the silicon layer 30 thus thinned.

Figure 12:
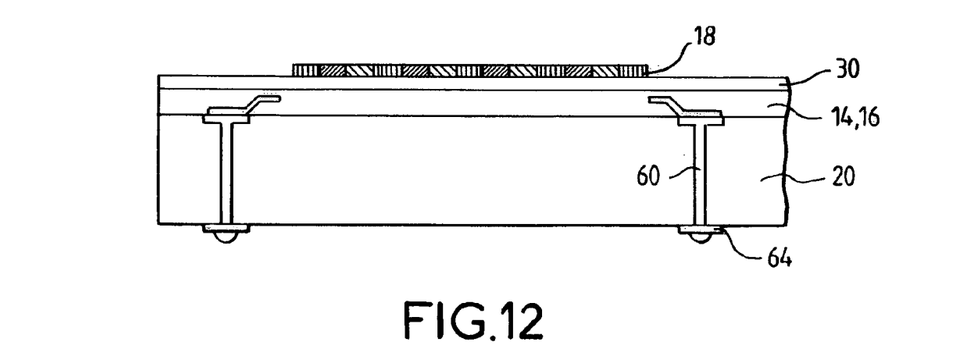

The metallized areas 64 located behind the supporting substrate 20 serve as input/output pads of the sensor since they are electrically connected to the image detection circuits formed in the thinned silicon wafer 30. These pads may be used a "wire-bonding" or preferably a "flip chip" type of connection. In the latter case, conductive bosses 66 are formed on the surface of the areas 64.

The structure can then be tested (the sensors are functional) and then diced into individual image sensors.

The invention claimed is:

1. A method for making a color image sensor, comprising steps of:
    forming on the front face of a semiconductive wafer, a series of active zones comprising image detection circuits and each corresponding to a respective image sensor, each active zone comprising photosensitive zones covered with conductive layers and insulating layers enabling the collection of electrical charges generated in the photosensitive zones,
    transferring the wafer by its front face against the front face of a supporting substrate,
    eliminating a major part of the thickness of the semiconductive wafer, leaving a very thin semiconductive layer on the substrate, this very thin semiconductive layer comprising the photosensitive zones,
    depositing and etching of color filters having several different colors on the thinned semiconductive layer.

2. The method according to claim 1, wherein the transfer is done by gluing, soldering, anodic bonding or simple molecular adhesion.

3. The method according to claim 2, wherein the thickness of the semiconductive wafer after thinning is about 8 to 30 micrometers, including the thickness of the stack of conductive layers and insulating layers.

4. The method according to claim 2, wherein, on the supporting substrate, prior to the transfer of the semiconductive wafer, there are formed metallized via holes laid out with the same geometry as connection pads formed on the semiconductive wafer around each active zone and coming into contact with these pads during the transfer, the metallized via holes opening into the rear of the supporting substrate to form input/output pads of the sensor.

5. The method according to claim 1, wherein the thickness of the semiconductive wafer after thinning is about 8 to 30 micrometers, including the thickness of the stack of conductive layers and insulating layers.

6. The method according to claim 5, wherein , on the supporting substrate, prior to the transfer of the semiconductive wafer, there are formed metallized via holes laid out with the same geometry as connection pads formed on the semiconductive wafer around each active zone and coming into contact with these pads during the transfer, the metallized via holes opening into the rear of the supporting substrate to form input/output parts of the sensor.

7. The method according to claim 1, wherein , on the supporting substrate, prior to the transfer of the semiconductive wafer, there are formed metallized via holes laid out with the same geometry as connection pads formed on the semiconductive wafer around each active zone and coming into contact with these pads during the transfer, the metallized via holes opening into the rear of the supporting substrate to form input/output pacts of the sensor.

8. An image sensor comprising;
    on a supporting substrate, a superimposed unit comprising firstly a semiconductive layer in which there is formed a matrix array of photosensitive zones and, secondly, a stack of conductive layers and insulating layers enabling the collection of the electrical charges generated by light in the photosensitive zones, wherein color filters of several different colors are deposited on this superimposed unit, on the very thin semiconductive layer side, so that the light passes through in the order given, through the color filters, and then the photosensitive semiconductive zones, and then the stack of insulating and conductive layers, without encountering said conductive layers, before reaching said very thin semiconductive layer.

9. The sensor according to claim 8, wherein the semiconductive layer containing the photosensitive zones has a thickness of about 3 to 20 micrometers above the stack of conductive and insulating layers.

10. The sensor according to claim 9, wherein the supporting substrate comprises active or passive circuit elements.

11. The sensor according to claim 9, wherein the semiconductive wafer and the supporting substrate are made of silicon.

12. The sensor according to claim 9, wherein the supporting substrate comprises metallized via holes arranged with the same geometry as connection pads formed on the silicon wafer around each active zone, and coming into contact with these pads during the transfer, the metallized via holes opening into the rear of the supporting substrate to form input/output pads of the sensor.

13. The sensor according to claim 8, wherein the supporting substrate comprises active or passive circuit elements.

14. The sensor according to claim 13, wherein the semiconductive wafer and the supporting substrate are made of silicon.

15. The sensor according to claim 13, wherein the supporting substrate comprises metallized via holes arranged with the same geometry as connection pads formed on the silicon wafer around each active zone, and coming into contact with these pads during the transfer, the metallized via holes opening into the rear of the supporting substrate to form input/output pads of the sensor.

16. The sensor according to claim 8, wherein the semiconductive wafer and the supporting substrate are made of silicon.

17. The sensor according to claim 16, wherein the supporting substrate comprises metallized via holes arranged with the same geometry as connection pads formed on the silicon wafer around each active zone, and coming into contact with these pads during the transfer, the metallized via holes opening into the rear of the supporting substrate to form input/output pads of the sensor.

18. The sensor according to claim 8, wherein the supporting substrate comprises metallized via holes arranged with the same geometry as connection pads formed on the silicon wafer around each active zone, and coming into contact with these pads during the transfer, the metallized via holes opening into the rear of the supporting substrate to form input/output pads of the sensor.

* * * * *